(12) United States Patent
Shigemitsu et al.

(10) Patent No.: US 11,409,078 B2
(45) Date of Patent: Aug. 9, 2022

(54) REFLECTION INTERFACE FOR CAMERA MODULE

(71) Applicant: Apple Inc., Cupertino, CA (US)

(72) Inventors: Norimichi Shigemitsu, Yokohama (JP); Ryozo Fukuzaki, Yokohama (JP)

(73) Assignee: Apple Inc., Cupertino, CA (US)

( * ) Notice: Subject to any disclaimer, the term of this patent is extended or adjusted under 35 U.S.C. 154(b) by 322 days.

(21) Appl. No.: 16/548,750

(22) Filed: Aug. 22, 2019

(65) Prior Publication Data
US 2020/0081224 A1 Mar. 12, 2020

Related U.S. Application Data

(60) Provisional application No. 62/729,379, filed on Sep. 10, 2018.

(51) Int. Cl.
*G02B 13/00* (2006.01)
*G02B 3/00* (2006.01)
(Continued)

(52) U.S. Cl.
CPC ......... *G02B 13/001* (2013.01); *G02B 3/0087* (2013.01); *G02B 15/22* (2013.01);
(Continued)

(58) Field of Classification Search
CPC .. G02B 27/0018; G02B 13/001; G02B 15/22; G02B 3/0087; H01L 27/14629; H04N 5/2254
(Continued)

(56) References Cited

U.S. PATENT DOCUMENTS

2007/0070859 A1* 3/2007 Hirayama .......... G02B 27/0172
369/112.04
2009/0008687 A1 1/2009 Katsuno et al.
(Continued)

FOREIGN PATENT DOCUMENTS

CN 1985317 6/2007
CN 101339952 1/2009
(Continued)

OTHER PUBLICATIONS

Basic Theory of the Field Flattener. Introduction to Lens Design with Practical Zemax Examples, by Joseph M. Geary, Willmann-Bell, 2007, pp. 163-165 (Year: 2007).*
(Continued)

*Primary Examiner* — Zachary W Wilkes
(74) *Attorney, Agent, or Firm* — Robert C. Kowert; Kowert, Hood, Munyon, Rankin & Goetzel, P.C.

(57) ABSTRACT

Various embodiments disclosed herein include camera equipment having a refractive index layer that causes internal reflection close to an image sensor of the camera. In some examples, internal reflection may occur at a boundary formed with the refractive index layer and located between an image sensor and an upper surface of a lens of the camera. The boundary may be formed between the refractive index layer and another material located between the refractive index layer and the image sensor, wherein the refractive index layer has a lower index of refraction than other material between the refractive index layer and the image sensor. The boundary formed with the refractive index layer may cause light to be reflected back toward the image sensor to improve image quality of images captured by the image sensor.

20 Claims, 6 Drawing Sheets

(51) Int. Cl.
   *G02B 27/00*    (2006.01)
   *G02B 15/22*    (2006.01)
   *H04N 5/225*    (2006.01)
   *H01L 27/146*   (2006.01)

(52) U.S. Cl.
   CPC .... *G02B 27/0018* (2013.01); *H01L 27/14629* (2013.01); *H04N 5/2254* (2013.01)

(58) Field of Classification Search
   USPC .................................................. 359/819, 738
   See application file for complete search history.

(56)      References Cited

U.S. PATENT DOCUMENTS

| 2011/0176023 | A1  | 7/2011  | Jung et al. |
| 2011/0195239 | A1* | 8/2011  | Takane .................. G02B 1/113 |
|              |     |         | 428/206 |
| 2014/0183334 | A1  | 7/2014  | Wang et al. |
| 2016/0343765 | A1  | 11/2016 | Tu |
| 2017/0176730 | A1  | 6/2017  | Ford et al. |
| 2017/0286743 | A1  | 10/2017 | Lee et al. |
| 2018/0039070 | A1  | 2/2018  | Mao et al. |
| 2019/0371847 | A1  | 12/2019 | Nakayama et al. |
| 2020/0176496 | A1* | 6/2020  | Kimura ................. H04N 5/2253 |
| 2020/0209596 | A1* | 7/2020  | Kimura .............. G02B 27/0018 |
| 2021/0223512 | A1* | 7/2021  | Nishimura ............. G02B 13/16 |

FOREIGN PATENT DOCUMENTS

| CN | 103915455  | 7/2014 |
| WO | 2018062559 | 4/2018 |

OTHER PUBLICATIONS

Office action from Chinese Application No. 201910811024.8, dated Dec. 23, 2020, (English translation and Chinese version), pp. 1-22.

* cited by examiner

REFLECTION INTERFACE FOR CAMERA MODULE

This application claims benefit of priority to U.S. Provisional Application No. 62/729,379, filed Sep. 10, 2018, titled "Reflection Interface for Camera Module", which is hereby incorporated by reference in its entirety.

BACKGROUND

Technical Field

This disclosure relates generally to a refractive index layer used with a lens or collection of lens that reduces artifacts in images caused by reflection of light within a camera.

Description of the Related Art

The advent of small, mobile multipurpose devices such as smartphones and tablet or pad devices has resulted in a need for high-resolution, small form factor cameras for integration in the devices. Some small form factor cameras may include one or more lenses located on top of an image sensor. In some small form factor cameras, a set of one or more lenses with a small z-dimension may include a concave lens that reduces field curvature of images captured using the camera. However, such a set of lenses may produce an undesirable artifact in a captured image, such as a ghost ring (or lens flare) that surrounds a light source in the captured image. For example, a light source such as a streetlight, a headlight, or even a reflective object in a field of view of a camera may direct light to a focused portion of an image sensor of the camera, wherein the light directed at the focused portion of the image sensor reflects off of the image sensor and is then reflected back towards the image sensor creating an undesirable artifact, such as a ghost ring or lens flare, in an image captured by the image sensor. The undesirable artifact may be caused by internal reflection of light off of the image sensor and within the set of lenses.

BRIEF DESCRIPTION OF THE DRAWINGS

FIG. 1A shows an example of internal reflection that produces a ghost ring effect surrounding a light source in an image. FIG. 1B shows a reflection interface at a boundary formed with a refractive index layer, wherein the refractive index layer is located proximate to an image sensor and reduces or eliminates a ghost ring effect as compared to the camera illustrated in FIG. 1A that does not include a refractive index layer proximate to the image sensor.

Figure 1A:
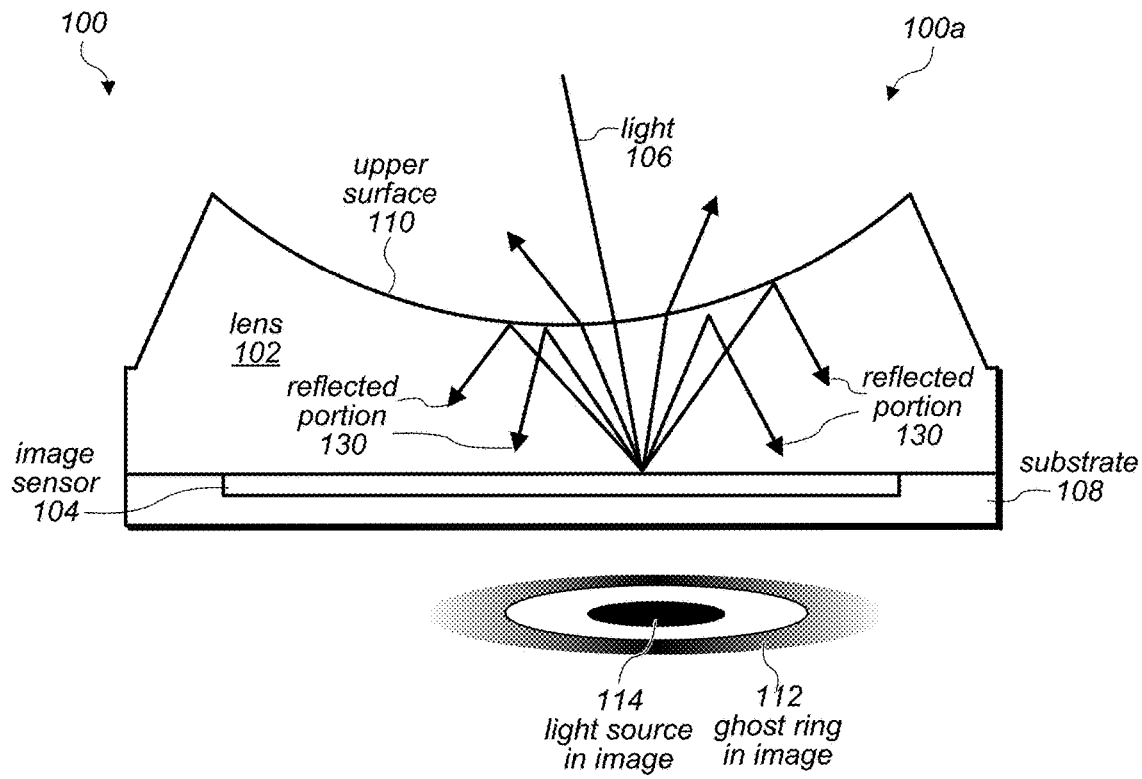
FIGS. 1A-1B each illustrates a respective example of internal reflection within a camera, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments disclosed herein include camera equipment including a camera comprising one or more lenses that includes a reflection interface at a boundary formed with a refractive index layer. The reflection interface formed with the refractive index layer is located proximate to an image sensor of the camera and reduces propagation of reflected light within the camera. The reflection interface may be an interface at a boundary between the refractive index layer and another material, such as a glass covering of an image sensor, wherein the refractive index layer has a lower index of refraction than the other material. The reduction of the propagation of reflected light within the camera may reduce or eliminate artifacts caused by light reflected within the camera, such as ghost rings, in images captured by the camera.

In some embodiments, a camera includes a lens, a refractive index layer, and an image sensor. In some embodiments, the image sensor may be coupled to glass covering and the refractive index layer may be located between the glass covering of the image sensor and the lens. In some embodiments, the camera may include a set of one or more lenses, wherein the set of lenses comprises a field flattener lens (e.g., a lens configured to reduce field curvature of an image captured via the image sensor). In some embodiments, a field flattener lens may be a concave lens that is an outermost lens of the set of lens. In some embodiments, a refractive index layer may form a boundary with one of the lenses of the set of lenses (the boundary formed with the refractive index layer may also be referred to herein as a "reflection interface"). Respective materials on either side of a boundary formed with a refractive index layer may have different optical properties, such as different refractive indexes, and the change in refractive indexes at the boundary may cause light to reflect off of the reflection interface. For example, the refractive index layer may be a layer applied to a surface of a lens on a side of the lens facing an image sensor. Also, the refractive index layer may have a lower index of refraction than another material disposed between the refractive index layer and the image sensor, such as a glass covering of the image sensor. The change in refractive indexes at the boundary formed with the refractive index layer may form a reflection interface that reflects at least some light back towards the images sensor before the light is reflected back into the lens.

Note that a refractive index of a material is a measure of how fast light propagates through the medium as compared to a speed at which light propagates through a vacuum, e.g. the speed of light in a vacuum. Thus at a boundary between two mediums having different refractive indexes, some light may bounce back at the boundary, e.g. (reflect) as opposed to changing propagation speed and refracting into the other medium on the other side of the boundary. Furthermore in some embodiments, the refractive index layer may be located between the image sensor and a lens. Thus, a reflection interface formed at the boundary between the refractive index layer and the lens may bounce back (e.g. reflect) light reflected off of the image sensor, such that the reflected light does not further propagate through the lens or additional portions of the camera. Because reflection of light off of the image sensor may be at least partially limited to a space between the image sensor and the refractive index layer that is proximate to the image sensor, a width and location of an artifact caused by the reflected light in an image captured by the image sensor may be limited. For example the size and location of the artifact may be limited such that the size and location of the artifact coincide with a light source shown in the image (such as street light), wherein the artifact does not extend significantly beyond the footprint of the light source in the captured image.

In various embodiments, a reflection interface formed with a refractive index layer may reflect at least a portion of light that has been reflected by an image sensor back towards the image sensor. For instance, a reflection interface formed with a refractive index layer may reflect a portion of light based at least in part on a difference between an index of refraction of the refractive index layer and an index of refraction of a material or medium disposed between the refractive index layer and the image sensor, such as glass covering of the image sensor. The light reflected back to the image sensor may be prevented from reaching any additional interfaces of the lens or other lens of the camera. For example, the reflection interface formed with the refractive index layer may be located such that concentrated light that is directed at a limited portion of the image sensor and reflected off of the image sensor is further reflected, by the reflection interface, back towards the limited portion of the image sensor, preventing the concreated light that is reflected off of the image sensor from being reflected back towards a larger portion of the image sensor. Said another way, at least a portion of light directed to a focus position on an image sensor and reflected off of the image sensor may be reflected back to the image sensor by a reflection boundary between a refractive index layer and another material or medium disposed between the refractive index layer and the image sensor, wherein the light reflected back to the image sensor is limited to an area of the image sensor closer to the focus position than if the light had been reflected back to the image sensor by another boundary in the camera located at a side of the lens opposite the refractive index layer.

In some embodiments, the refractive index layer may include silica beads. The silica beads may have air inside of them. Furthermore, the refractive index layer may include a binding material surrounding one or more of the silica beads.

In some embodiments, a camera may be part of a device (e.g., a mobile multifunction device). For instance, the device may further include a display and one or more processors. In some instances, the processor(s) may be configured to cause the display to present one or more images, e.g., images captured at least partly via an image sensor of the camera.

According to some examples, a camera may include an upper and lower lens assembly. The upper lens assembly may include one or more lenses held by a lens holder. In some embodiments, the lower lens assembly may be located between the lens holder of the upper lens assembly and the image sensor and may include a reflection interface at a boundary between a refractive index layer and another material, such as a glass covering of the image sensor.

In some embodiments, an image sensor of a camera may be configured to capture light that has passed through one or more lenses of the camera. In various embodiments, one or more lenses of the camera may be coupled to the image sensor. For instance, a lens may be attached to the image sensor via an adhesive. In some embodiments, the one or more lenses of the camera may include a field flattener lens (e.g., a lens configured to reduce field curvature of an image captured via the image sensor, such as a concave lens).

According to various embodiments, a camera may include a reflection interface formed with a refractive index layer and another medium of the camera, such as a lens, or glass covering of the image sensor, etc. The other medium may have a first index of refraction, and the refractive index layer may have a second index of refraction that is lower than the first index of refraction of the other medium. The reflection interface may reflect (e.g., at a location between the image sensor and an upper surface of a lens of the camera), at least a portion of light that has been reflected off of the image sensor, such that the portion of light is reflected by the reflection interface back to the image sensor. Thus, in some embodiments, light initially reflected off of the image sensor and reflected back toward the image sensor may be at least partially contained to a limited region of the image sensor, thereby reducing the size of artifacts caused by the reflected light. In some embodiments, the refractive index layer may be an air gap, wherein a first layer (e.g., a glass layer) that is attached to the image sensor, and a boundary with the air gap (e.g. the refractive index layer) on another side of the first layer may form a reflection interface at the boundary of the first layer and the air gap.

In some embodiments, a lens may be coupled to an image sensor. For instance, the lens may be adhered to the image sensor. In some embodiments, the lens may comprise a field flattener layer (e.g., a lens configured to reduce field curvature of an image captured via the image sensor, such as a concave lens). Additionally, a refractive index layer may be positioned between the lens adhered to the image sensor and another lens of the camera, wherein the refractive index layer forms a reflection interface that prevents reflected light from passing into the other lens.

In various embodiments, an interface (e.g., a reflection interface) at a boundary formed with a refractive index layer may reflect at least a portion of light that has been reflected by the image sensor, such that the portion of light is reflected by the reflection interface back to the image sensor. For instance, the reflection interface may reflect the portion of light based at least in part on a difference between an index of refraction of the refractive index layer and an index of refraction of a material that forms the boundary with the refractive index layer.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

Figure 1B:
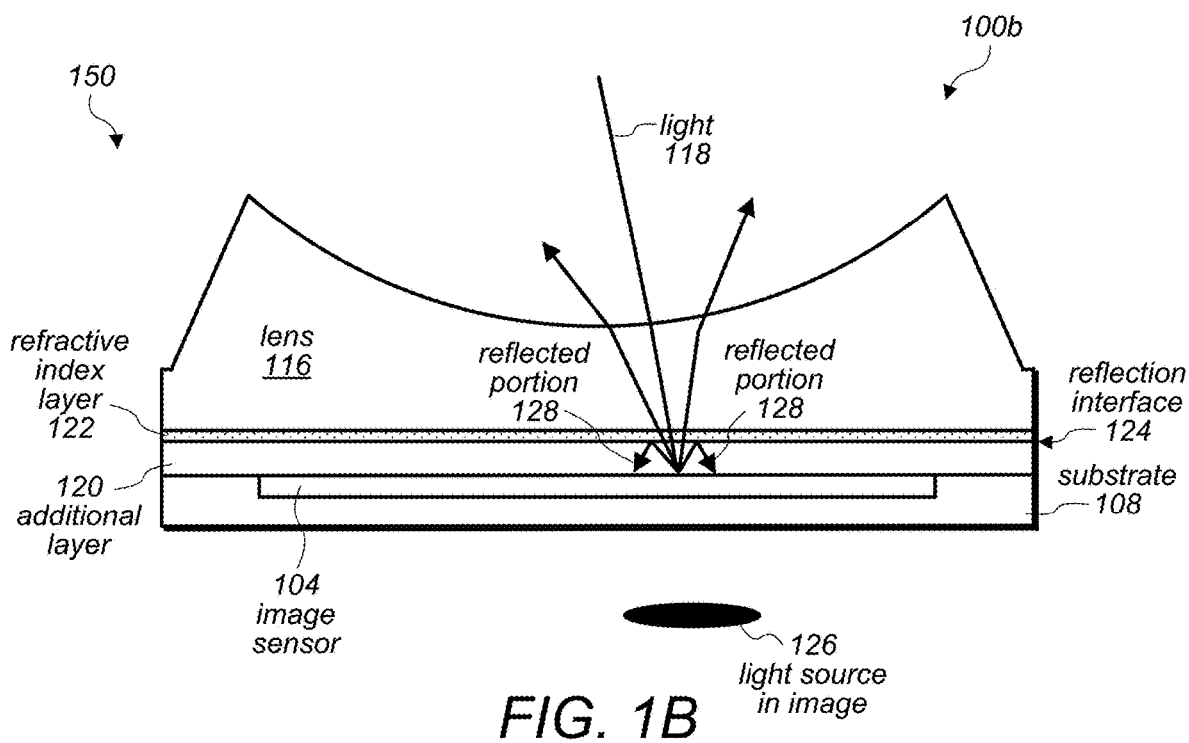

FIGS. 1A-1B each illustrates a respective example of internal reflection within a camera, in accordance with some embodiments. FIG. 1A shows an example 100a of internal reflection within a camera that produces a ghost ring effect surrounding a light source in an image. FIG. 1B shows an example 100b of internal reflection within a camera, wherein a reflection interface located proximate to an image sensor reduces or eliminates the ghost ring effect, according to some embodiments. In some embodiments, example 100a and/or example 100b may include one or multiple features, components, and/or functionality of embodiments described herein with reference to FIGS. 2-9.

In the example 100a shown in FIG. 1A, the camera 100 may include an outer lens 102 and an image sensor 104. The image sensor 104 may be configured to capture light 106 that has passed through the outer lens 102. In some embodiments, the camera 100 may include a substrate 108 (e.g., an image sensor substrate) that is part of the image sensor 104.

At least a portion of light 106 that passes through the outer lens 102 may be reflected by the image sensor 104 back through the outer lens 102 to upper surface 110 of the outer lens 102. In some instances, light 106 that has been reflected by the image sensor 104 may further be reflected by a portion (e.g., an upper surface 110) of the outer lens 102 back to the image sensor 104, e.g., as indicated in FIG. 1A (shown as reflected portion 130). Such reflection of reflected portion 130 by the portion (e.g. upper surface 110) of the outer lens 102 back to the image sensor 104 may cause artifacts to appear in images captured by image sensor 104. For example, the reflected portion 130 of the light 106 reflected off of upper surface 110 of outer lens 102 may be reflected at an angle that increases a radius of a ring (e.g. ghost ring 112) formed by the reflected light. In some situations, light 106 may emanate from a light source in a field of view for an image being captured by camera 100 via image sensor 104.

For example, a field of view of a camera 100 may include a light source, such as a street light, candle, flashlight, stadium light, or any other type of light source. In some situations a light source may be a light colored object or reflective object in a field of view of a camera 100 and may have any one of various shapes. Light from the light source may be focused on a focus position on the image sensor and when internally reflected within a camera may cause artifacts, such as ghost rings to appear in images captured of a scene that includes the light source. However, if the reflected light is reflected to a portion of the image sensor that captures the portion of the field of view that corresponds to the light source (as shown by light source 114), the effects of the reflected light may overlap with the light source 114 in a captured image such that ghost rings are not perceptible or minimized in the captured image. Thus the image quality may be improved by causing any "ghost rings" to at least partially overlap with, or not extend significantly beyond, the light source (e.g. the street light, the candle, the flashlight, the stadium light, etc.) in the image such that the "ghost rings" are not perceptible in the captured image. Thus, the reflected light may be limited to an area of the image sensor closer to a focus position of the light source on the image sensor than if the light had been reflected back to the image sensor by another boundary in the camera located further away from the image sensor.

In the example 100b shown in FIG. 1B, the camera 150 may include an outer lens 116, refractive index layer 122, and additional layer 120. The camera 150 also includes an image sensor 104. The image sensor 104 may be configured to capture light 118 in a field of view of the camera 150, wherein the light 118 has passed through the outer lens 116, the refractive index layer 122, and the additional layer 120. The additional layer 120 may be a glass or plastic covering of the image sensor and may have a first index of refraction, and the refractive index layer 122 may have a second index of refraction that is different than the first index of refraction. According to various examples, the second index of refraction of the refractive index layer 122 may be lower than the first index of refraction of the additional layer 120. In some examples, the first index of refraction of the additional layer 120 may be greater than 1.4. Furthermore, in some examples, the second index of refraction of the refractive index layer 122 may be less than 1.3. The refractive index layer 122 may be considered a "low index layer" as compared to the additional layer 120 because the refractive index layer 122 may have a lower index of refraction than the additional layer 120.

According to various embodiments, the additional layer 120 and the refractive index layer 122 may form a reflection interface 124 at a boundary between the additional layer 120 and the refractive index layer 122. For example, the additional layer 120 may be a glass or plastic layer adjacent to the refractive index layer 122 such that the two layers meet at a boundary between the two layers that forms a reflection interface 124. The reflection interface 124 may be configured to reflect at least a portion of light 118 (shown as reflected portion 128) that has been reflected by the image sensor 104, such that the reflected portion 128 is reflected by the reflection interface 124 back to the image sensor 104, e.g., as indicated in FIG. 1B. For instance, the reflection interface 124 may reflect the reflected portion 128 of light 118 based at least in part on a difference between the first index of refraction of the additional layer 120 and the second index of refraction of the refractive index layer 122. Such reflection by the reflection interface 124 back to the image sensor 104 may be an internal reflection that produces little to no ghost ring. For instance, the ghost ring produced by the reflected light 128 in example 100b (FIG. 1B) may be less than the ghost ring produced by the reflected light 130 in example 100a (FIG. 1A). In various embodiments, the reflection interface 124 between the additional layer 120 and the refractive index layer 122 may be located proximate to the image sensor 104. As such, the size of the ghost ring produced by the reflected light 128 in example 100b may not be significantly larger than the size of the light source 126 in the image captured via the image sensor 104, and thus the ghost ring may appear as part of the light source 126 in the image.

In some embodiments, the materials of the additional layer 120 and the refractive index layer 122 may be configured such that the difference in refractive indexes of the two layers at the boundary between the two layers, e.g. the reflection interface 124, causes total internal reflection (TIR) of reflected light.

Figure 2:
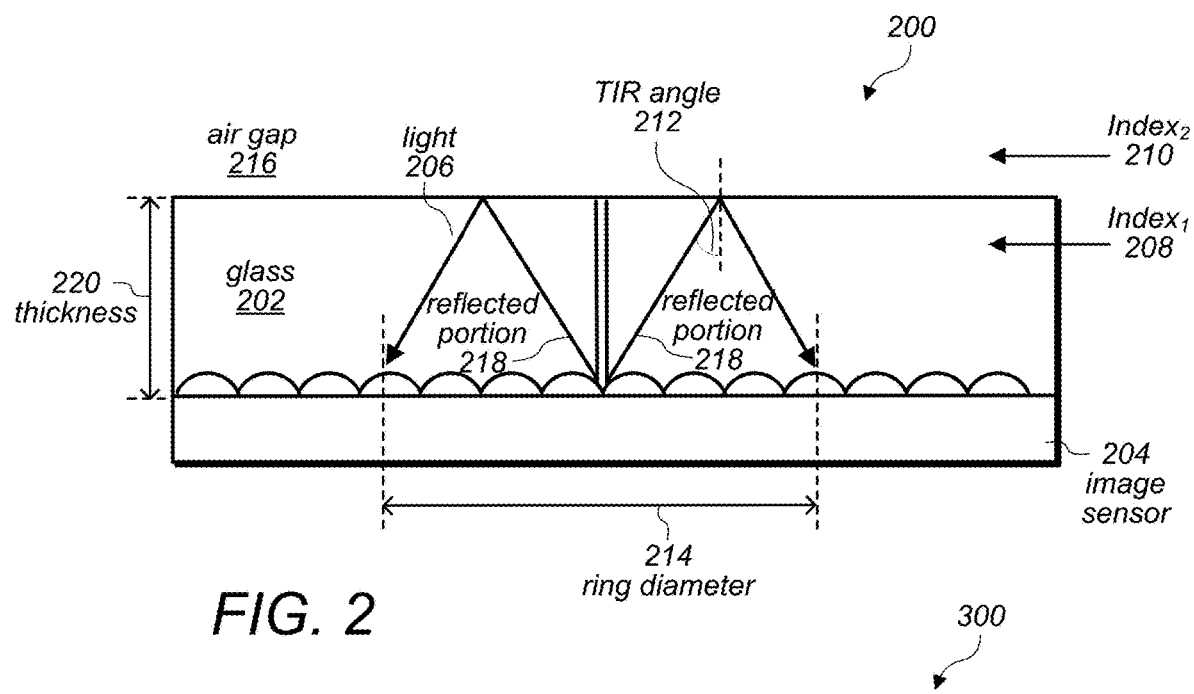
FIG. 2 illustrates an example of how internal reflection within a camera may affect ghost ring size and location, in accordance with some embodiments.

FIG. 2 illustrates an example 200 of how internal reflection within may affect ghost ring size, in accordance with some embodiments. In some embodiments, example 200 may include one or multiple features, components, and/or functionality of embodiments described herein with reference to FIGS. 1A, 1B, and 3-9.

In some embodiments, a camera may include a glass layer 202 and an image sensor 204 as shown in FIG. 2. The image sensor 204 may be configured to capture light 206 that has passed through the glass layer 202. In some embodiments, a glass layer 202 may have a first index of refraction ("Index$_1$") 208. Another portion of the camera above the glass layer 202, such as a refractive index layer, may have a second index of refraction ("Index$_2$") 210. For instance, the portion above glass layer 202 may be an air gap 216 comprising air (or in some embodiments another gas other than air) that has a different index of refraction than the glass layer 202. The air gap may function as a refractive index layer and form a boundary with the glass layer 202 that function as a reflection interface. In some examples, the second index of refraction 210 of the air gap 216 may be lower than the first index of refraction 208 of the glass layer 202.

Total internal reflection (TIR) may occur when a propagated wave (such as light passing through glass layer 202) strikes a boundary (such as a boundary between glass layer 202 and air gap 216, e.g. a reflection interface) at an angle larger than a TIR angle. As shown in FIG. 2, when reflected light portion 218 strikes the reflection interface formed by the boundary of glass layer 202 and air gap 216 at an angle equal to or greater than the TIR angle 212, the reflected light portion 218 is reflected off of the boundary between the glass layer 202 and air gap 216. In comparison, as shown in FIG. 1B some of internally reflected light 128 that strikes reflection interface 124 at an angle less than a TIR angle may pass through the reflection interface 124. However, such reflected light that passes through the reflection interface 124 in FIG. 1B may exit the camera 150, or if reflected at the interface of outer lens 116 and air surrounding outer lens 116, the amount of reflected light may be negligible.

In some examples, the TIR angle 212 may be characterized as:

TIR angle=$\sin^{-1}(\text{Index}_2/\text{Index}_1)$, where index 1 is a refractive index of a first layer and index 2 is a refractive index of a second layer, wherein the first layer and the second layer form a reflective interface at a boundary between the layers. For example, index 1 may be first index of refraction 208 and index 2 may be second index of refraction 210.

Furthermore, in some examples, the ring diameter 214 of a ghost ring produced by the TIR of reflected light portion 218 may be characterized as:

ring diameter=$\tan\{\sin^{-1}(\text{Index}_2/\text{Index}_1)\} \bullet \text{thickness} \bullet 4$, where "thickness" is the thickness 220 of the glass layer 202 in FIG. 2. In some embodiments, the thickness 220 may be a vertical distance from the image sensor 204 to the interface between the layer having the first index of refraction 208 and the air gap or other type of refractive index layer having the second index of refraction 210.

Figure 3:
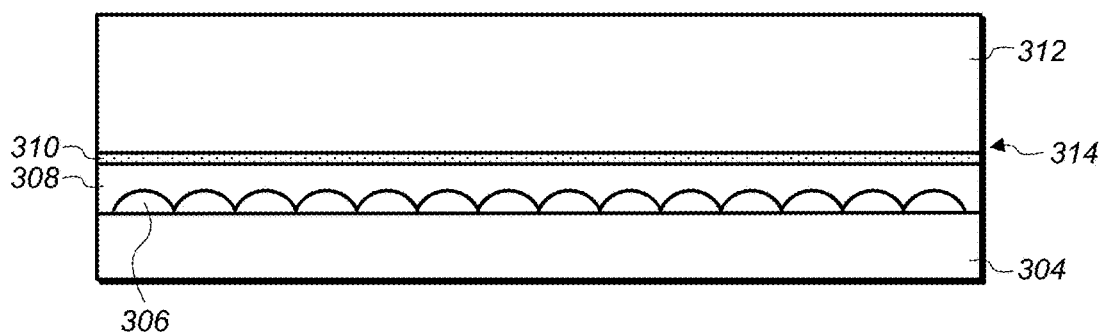
FIG. 3 illustrates a schematic cross-sectional view of an example camera that includes a reflection interface at boundary formed with a refractive index layer, in accordance with some embodiments.

FIG. 3 illustrates a schematic cross-sectional view of an example image sensor package 300 that includes a refractive index layer that forms a reflection interface, in accordance with some embodiments. In some embodiments, the image sensor package 300 may include one or multiple features, components, and/or functionality of embodiments described herein with reference to FIGS. 1A-2 and 4-9.

In some embodiments, the image sensor package 300 may include an image sensor 304, a refractive index layer 310 and a glass (or plastic) layer 312. The image sensor 304 may be configured to capture light that has passed through the glass layer 312. An adhesive 308 may attach the glass layer 312 with attached refractive index layer 310 to the image sensor 304. In some embodiments, the image sensor package 300 may comprise field flattener lens (e.g., a lens configured to reduce field curvature of an image captured via the image sensor 304, such as a concave lens). However, the sensor package 300 may include other types of lens in other embodiments. The image sensor package 300 may include a refractive index layer 310 that has a first index of refraction. Furthermore, the image sensor package 300 may include an additional layer, such as a glass layer 312, that has a second index of refraction that is lower than the first index of refraction of the refractive index layer 310.

According to various embodiments, the refractive index layer 310 and the glass layer 312 may interface at a reflection interface 314. In various embodiments, the reflection interface 314 may reflect at least a portion of light that has been reflected by the image sensor 304, such that the portion of light is reflected by the reflection interface 314 back to the image sensor 304. For instance, the reflection interface 314 may reflect the portion of light based at least in part on a difference between the first index of refraction of the refractive index layer 310 and a second index of refraction of the glass layer 312.

In some examples, the refractive index layer 310, the glass layer 312, and/or the reflection interface 314 may be located proximate to the image sensor 304. For example, the reflection interface 314 may be located closer to the image sensor 304 than to an upper surface of the glass layer 312.

In some embodiments, at least a portion of the refractive index layer 310 that has the first index of refraction may extend along a first plane, and at least a portion of the additional layer, e.g. the glass layer 312 that has the second index of refraction, may extend along a second plane that is substantially parallel to the first plane. The first plane may be located between the image sensor 304 and the second plane. Furthermore, the second plane may be located between the first plane and an upper surface of the glass layer 312. In various embodiments, the image sensor may define a plane that is substantially parallel to the first plane and/or the second plane.

In some embodiments, an image sensor, such as image sensor 304, may include one or more on chip mounted lenses 306. In some embodiments, an adhesive 308 may attach the glass layer 312 with attached refractive index layer 310 to the on chip lenses 306 of the image sensor 304.

Figure 4:
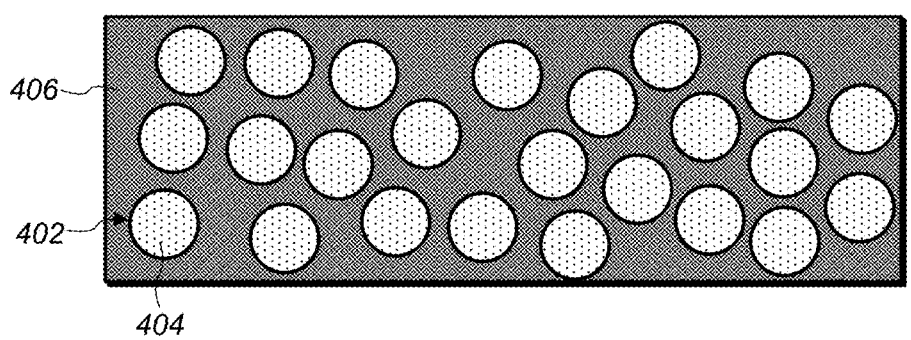
FIG. 4 illustrates a cross-sectional view of an example refractive index layer, in accordance with some embodiments.

FIG. 4 illustrates a cross-sectional view of an example low refractive index layer 400 that may be used in a camera having a reflection interface, in accordance with some embodiments. In some embodiments, the low refractive index layer 400 may include one or multiple features, components, and/or functionality of embodiments described herein with reference to FIGS. 1A-3 and 5-9.

In some embodiments, the low refractive index layer 400 may include one or more beads 402 (e.g., silica beads). According to some examples, the beads 402 may be hollow and/or have air 404 inside of them. The low index layer 400 may have a low index of refraction as compared to another layer of a camera, such as a glass layer of an image sensor, based at least in part on air 404 within the beads 402. For example, air may have a refractive index of approximately 1, whereas glass may have a refractive index greater than air, such as 1.3-1.5, as an example. In some embodiments, one or more of the beads 402 may be surrounded by a binding material 406.

Figure 5:
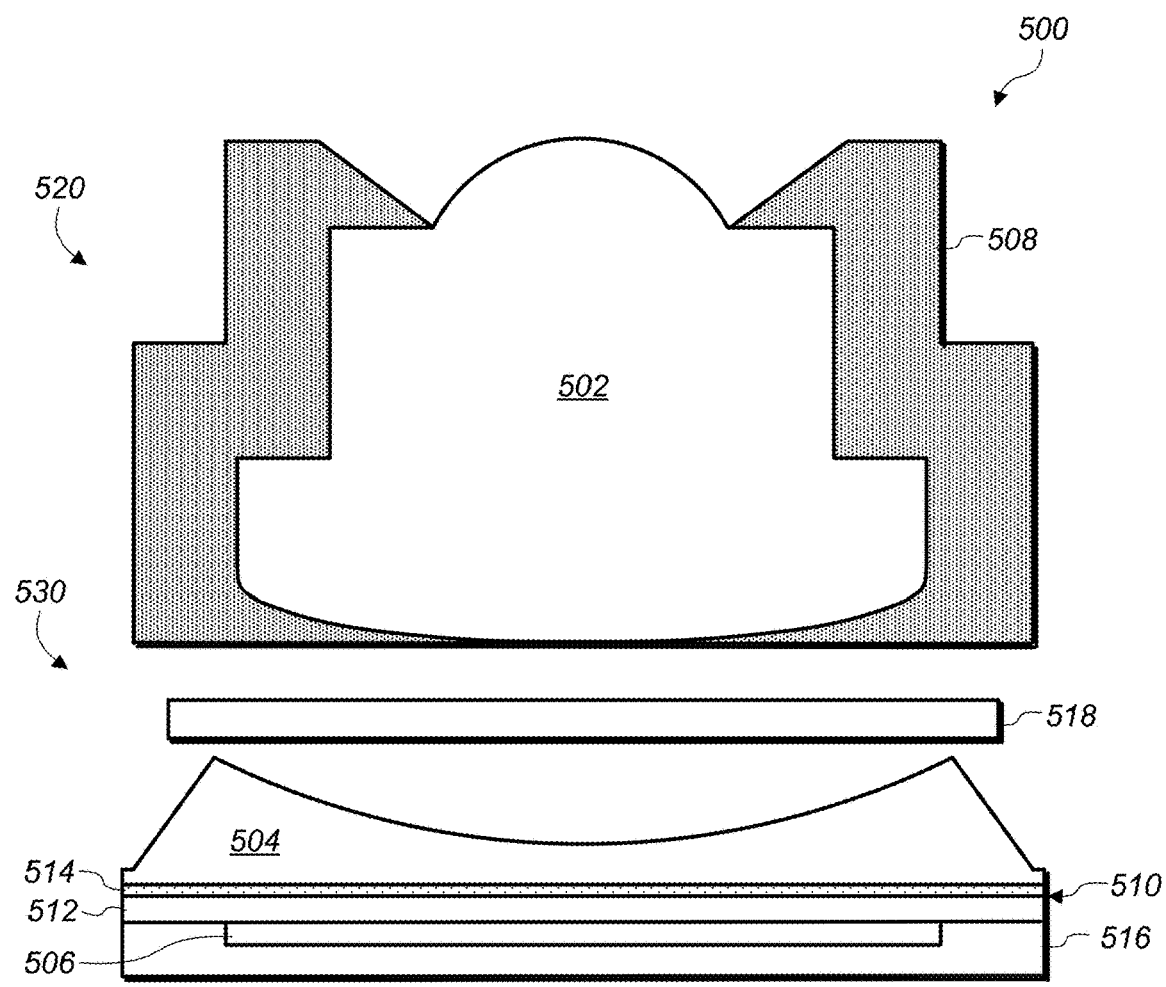
FIG. 5 illustrates a schematic cross-sectional view of an example camera comprising an upper lens assembly and a lower lens assembly, wherein the lower lens assembly includes a refractive index layer, in accordance with some embodiments.

In some non-limiting examples, the low index layer 400 may form at least part of refractive index layer 122 (FIG. 1B), refractive index layer 310 (FIG. 3), and/or refractive index layer 510 (FIG. 5).

FIG. 5 illustrates a schematic cross-sectional view of an example camera 500 that includes a reflection interface, in accordance with some embodiments. In some embodiments, the camera 500 may include one or multiple features, components, and/or functionality of embodiments described herein with reference to FIGS. 1A-4 and 6-9.

In some embodiments, the camera 500 may include an upper lens assembly 520, a lower lens assembly 530, and an image sensor 506. The image sensor 506 may be configured to capture light that has passed through the upper lens assembly 520 and the lower lens assembly 530. The upper lens assembly 520 may include one or more lenses 502 that are held by a lens holder 508 in some embodiments. The lower lens assembly 530 may include a lens 504 located between the image sensor 506 and the upper lens assembly 520, and/or between the image sensor 506 and the lens holder 508. In some examples, the lens 504 of the lower lens assembly 530 may be coupled to the image sensor 506. For instance, the lens 504 of the lower lens assembly 530 may be attached to the image sensor 506 via an adhesive, e.g., as discussed above with reference to FIG. 3.

In some cases, the lens 504 of the lower lens assembly 530 may be a concave lens, e.g., as indicated in FIG. 5. Additionally, or alternatively, the lens 504 of the lower lens assembly 530 may be a field flattener lens that is configured to reduce field curvature of an image captured via the image sensor 506.

According to various embodiments, the camera and lens system 500 may include a reflection interface 510. For instance, the reflection interface 510 may be an interface between a glass layer 512 of the lower lens assembly 530 and a refractive index layer 514. The glass layer 512 may have a first index of refraction. The refractive index layer 514 may have a second index of refraction. In some embodiments, the refractive layer 514 may have a lower index of refraction than the glass layer 512. In some examples, the first index of refraction of the glass layer 512 may be greater than 1.4, and the second index of refraction of the refractive index layer 514 may be less than 1.3.

In some examples, the reflection interface 510 may reflect at least a portion of light that has been reflected by the image sensor 506, such that the portion of light is reflected by the reflection interface 510 back to the image sensor 506. Also, in some embodiments, the reflection interface 510 may produce total internal reflection (TIR). For instance, total internal reflection may occur at a location between the image sensor 506 and an upper surface of the lens 504.

In some embodiments, the glass layer 512 and the refractive index layer 514 may be coupled with lens 504, e.g., as indicated in FIG. 5. However, in some embodiments, the glass layer 512 and/or the refractive index layer 514 may be separated from an additional lens layer. For instance, as discussed below with reference to FIG. 6, the glass layer 512 may be attached to the image sensor 504, and a reflection interface may be formed at a boundary between the glass layer 512 and an air gap.

In some embodiments, an image sensor assembly may include a substrate 516 (e.g., an image sensor substrate) that is part of the image sensor, wherein the image sensor includes a light receiving part and a logic area, wherein the substrate 516 is coupled to the logic area of the image sensor and the portion of the image sensor labeled as 506 comprises the light receiving portion. Furthermore, in some embodiments, the camera 500 may include a filter 518 (e.g., an infrared filter). The filter 518 may be located between the one or more lenses 502 of the upper lens assembly 520 and the lens 504 of the lower lens assembly 530, in some embodiments. As such, in some instances, light may pass through the one or more lenses 502 of the upper lens assembly 520, then through the filter 518, then through the components of the lower lens assembly 530, and to the image sensor 506. It should be understood, however, that the filter 518 may be located differently in other embodiments. As an example, the filter 518 may be located above the one or more lenses 502 of the upper lens assembly 520. As another example, the filter 518 may be located below the lens 504 of the lower lens assembly 530.

According to some embodiments, the camera module 500 may include one or more actuators (not shown) to move the one or more lenses 502 of the upper lens assembly 520, one or more actuators (not shown) to move the lens 504 of the lower lens assembly 530, and/or one or more actuators (not shown) to move the image sensor 506. The actuator(s) may be used to provide autofocus (AF) and/or optical image stabilization (OIS) functionality. In some cases, the actuator(s) may include one or more voice coil motor (VCM) actuators that include one or more magnets and one or more coils. The magnet(s) and coil(s) may magnetically interact to produce Lorentz forces that move the one or more lenses 502 of the upper lens assembly 520, the lens 504 of the lower lens assembly 530, and/or the image sensor 506. As an example, the camera and lens system 500 may include a VCM actuator to move the one or more lenses 502 of the upper lens assembly 520, relative to the lower lens assembly 530 and/or the image sensor 506, along an optical axis to provide AF movement. As another example, the VCM actuator may be configured to move the one or more lenses 502 of the upper lens assembly, relative to the lower lens assembly 530 and/or the image sensor 506, in directions orthogonal to the optical axis to provide OIS movement.

Figure 6:
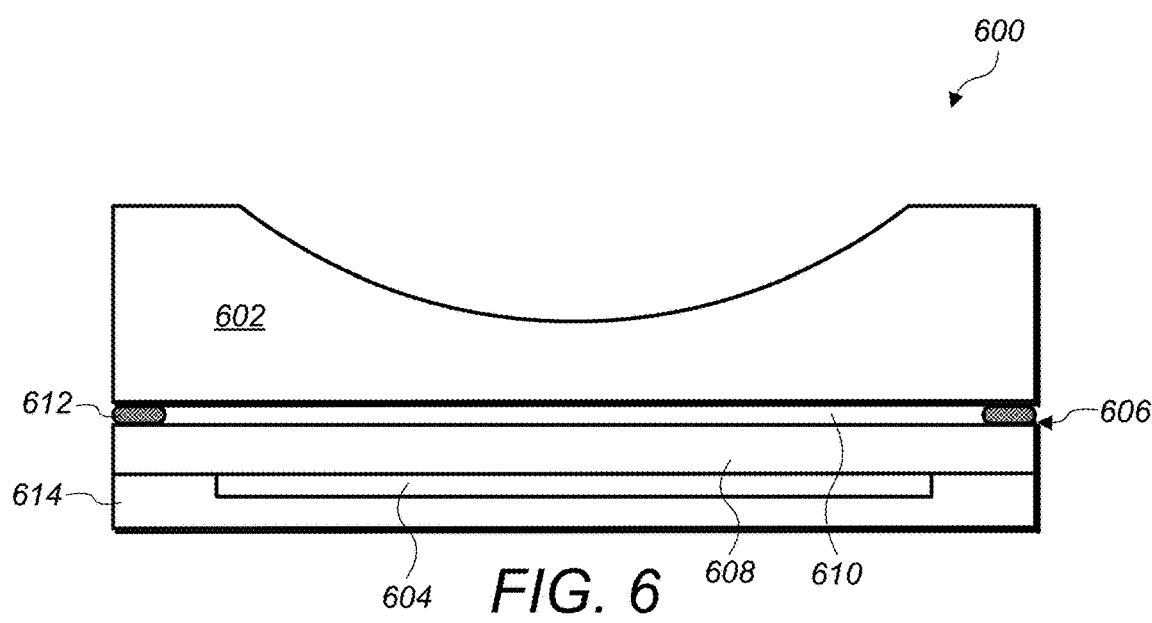
FIG. 6 illustrates a schematic cross-sectional view of another example camera, wherein a reflection interface is formed at a boundary with a refractive index layer, wherein the refractive index layer is an air gap, in accordance with some embodiments.

FIG. 6 illustrates a schematic cross-sectional view of another example camera 600 that includes a reflection interface, in accordance with some embodiments. In some embodiments, the camera 600 may include one or multiple features, components, and/or functionality of embodiments described herein with reference to FIGS. 1A-5 and 7-9.

In some embodiments, the camera 600 may include a lens 602 and an image sensor 604. The image sensor 604 may be configured to capture light that has passed through the lens 602. In some embodiments, the lens 602 may be a concave lens or other type of field flattening lens that is configured to reduce field curvature of an image captured via the image sensor 604.

According to some embodiments, the camera 600 may include a reflection interface 606 at a boundary between a first layer 608 and a gap layer 610, e.g. an air gap. For instance, the reflection interface 606 may be an interface between a first layer 608 and a gap portion 610. The gap portion, such as gap portion 610, may function as a refractive index layer. The first layer 608 may have a first index of refraction, and the gap portion 610 may have a second index of refraction that is lower than the first index of refraction. For instance, the first layer 608 may be a glass layer attached to the image sensor 604, and the gap portion 610 may be a gap located between the first layer 608 and the lens 602. In some embodiments, the gap portion may comprise air, or other gasses, such as nitrogen, helium, hydrogen, etc. In some embodiments, a gap portion may be a vacuum layer. In some embodiments, a lower surface of a glass layer (first layer 608) may be attached to the image sensor 604. An upper surface of the glass layer may be spaced apart from a lower surface of the lens 602 via one or more spacers 612 to form the gap layer (gap portion 610). A portion of the upper surface of the glass layer may be coupled to a portion of the lower surface of the lens 602 via the spacer(s) 612.

In some embodiments, the image sensor 604 may include a substrate 614 (e.g., an image sensor substrate) that is part of the image sensor 604. In some cases, the camera 600 may include a filter (e.g., an infrared filter). For instance, the filter may be the first layer 608 in some embodiments.

Figure 7:
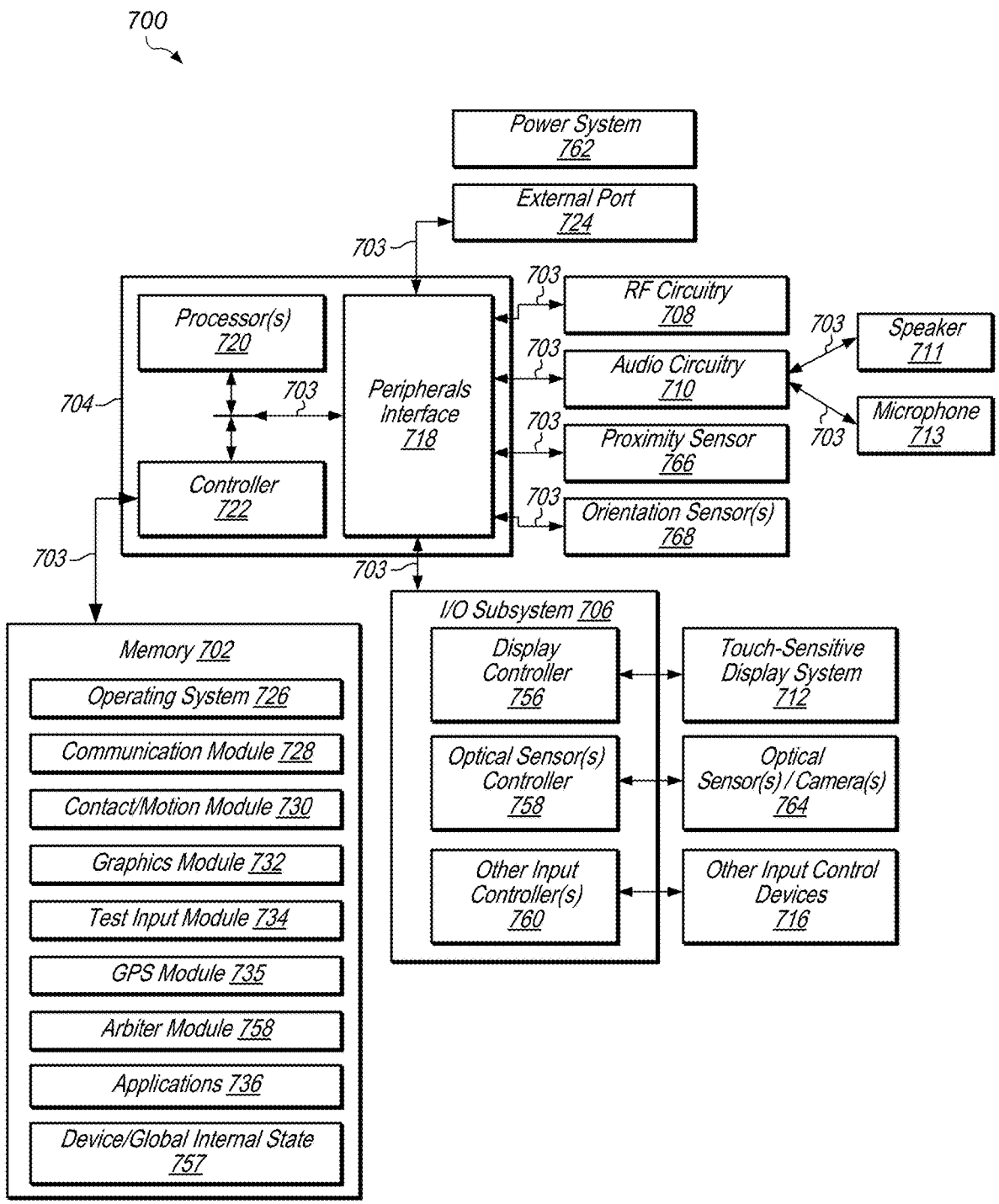
FIG. 7 illustrates a block diagram of an example portable multifunction device that may include a camera comprising a lens and one more refractive index layers, in accordance with some embodiments.

FIG. 7 illustrates a block diagram of an example portable multifunction device 700 that may include a camera having a reflection interface, in accordance with some embodiments. In some embodiments, the portable multifunction device 700 may include one or multiple features, components, and/or functionality of embodiments described herein with reference to FIGS. 1-6, 8, and 9.

Camera(s) 764 is sometimes called an "optical sensor" for convenience, and may also be known as or called an optical sensor system. Device 700 may include memory 702 (which may include one or more computer readable storage mediums), memory controller 722, one or more processing units (CPUs) 720, peripherals interface 718, RF circuitry 708, audio circuitry 710, speaker 711, touch-sensitive display system 712, microphone 713, input/output (I/O) subsystem 706, other input or control devices 716, and external port 724. Device 700 may include one or more optical sensors 764. These components may communicate over one or more communication buses or signal lines 703.

It should be appreciated that device 700 is only one example of a portable multifunction device, and that device 700 may have more or fewer components than shown, may combine two or more components, or may have a different configuration or arrangement of the components. The various components shown in FIG. 7 may be implemented in hardware, software, or a combination of hardware and software, including one or more signal processing and/or application specific integrated circuits.

Memory 702 may include high-speed random access memory and may also include non-volatile memory, such as one or more magnetic disk storage devices, flash memory devices, or other non-volatile solid-state memory devices. Access to memory 702 by other components of device 700, such as CPU 720 and the peripherals interface 718, may be controlled by memory controller 722.

Peripherals interface 718 can be used to couple input and output peripherals of the device to CPU 720 and memory 702. The one or more processors 720 run or execute various software programs and/or sets of instructions stored in memory 702 to perform various functions for device 700 and to process data.

In some embodiments, peripherals interface 718, CPU 720, and memory controller 722 may be implemented on a single chip, such as chip 704. In some other embodiments, they may be implemented on separate chips.

RF (radio frequency) circuitry 708 receives and sends RF signals, also called electromagnetic signals. RF circuitry 708 converts electrical signals to/from electromagnetic signals and communicates with communications networks and other communications devices via the electromagnetic signals. RF circuitry 708 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 708 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 710, speaker 711, and microphone 713 provide an audio interface between a user and device 700. Audio circuitry 710 receives audio data from peripherals interface 718, converts the audio data to an electrical signal, and transmits the electrical signal to speaker 711. Speaker 711 converts the electrical signal to human-audible sound waves. Audio circuitry 710 also receives electrical signals converted by microphone 713 from sound waves. Audio circuitry 710 converts the electrical signal to audio data and transmits the audio data to peripherals interface 718 for processing. Audio data may be retrieved from and/or transmitted to memory 702 and/or RF circuitry 708 by peripherals interface 718. In some embodiments, audio circuitry 710 also includes a headset jack (e.g., 812, FIG. 8). The headset jack provides an interface between audio circuitry 710 and removable audio input/output peripherals, such as output-only headphones or a headset with both output (e.g., a headphone for one or both ears) and input (e.g., a microphone).

I/O subsystem 706 couples input/output peripherals on device 700, such as touch screen 712 and other input control devices 716, to peripherals interface 718. I/O subsystem 706 may include display controller 756 and one or more input controllers 760 for other input or control devices. The one or more input controllers 760 receive/send electrical signals from/to other input or control devices 716. The other input control devices 716 may include physical buttons (e.g., push buttons, rocker buttons, etc.), dials, slider switches, joysticks, click wheels, and so forth. In some alternate embodiments, input controller(s) 760 may be coupled to any (or none) of the following: a keyboard, infrared port, USB port, and a pointer device such as a mouse. The one or more buttons (e.g., 808, FIG. 8) may include an up/down button for volume control of speaker 711 and/or microphone 713. The one or more buttons may include a push button (e.g., 806, FIG. 8).

Touch-sensitive display 712 provides an input interface and an output interface between the device and a user. Display controller 756 receives and/or sends electrical signals from/to touch screen 712. Touch screen 712 displays visual output to the user. The visual output may include graphics, text, icons, video, and any combination thereof (collectively termed "graphics"). In some embodiments, some or all of the visual output may correspond to user-interface objects.

Touch screen 712 has a touch-sensitive surface, sensor or set of sensors that accepts input from the user based on haptic and/or tactile contact. Touch screen 712 and display controller 756 (along with any associated modules and/or sets of instructions in memory 702) detect contact (and any movement or breaking of the contact) on touch screen 712 and converts the detected contact into interaction with user-interface objects (e.g., one or more soft keys, icons, web pages or images) that are displayed on touch screen 712. In an example embodiment, a point of contact between touch screen 712 and the user corresponds to a finger of the user.

Touch screen 712 may use LCD (liquid crystal display) technology, LPD (light emitting polymer display) technology, or LED (light emitting diode) technology, although other display technologies may be used in other embodiments. Touch screen 712 and display controller 756 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 712. In an example embodiment, projected mutual capacitance sensing technology is used.

Touch screen 712 may have a video resolution in excess of 800 dpi. In some embodiments, the touch screen has a video resolution of approximately 860 dpi. The user may make contact with touch screen 712 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 700 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 712 or an extension of the touch-sensitive surface formed by the touch screen.

Device 700 also includes power system 762 for powering the various components. Power system 762 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 700 may also include one or more optical sensors or cameras 764. FIG. 7 shows an optical sensor 764 coupled to optical sensor controller 758 in I/O subsystem 706. Optical sensor 764 may include charge-coupled device (CCD) or complementary metal-oxide semiconductor (CMOS) phototransistors. Optical sensor 764 receives light from the environment, projected through one or more lens, and converts the light to data representing an image. In conjunction with imaging module 743 (also called a camera module), optical sensor 764 may capture still images or video. In some embodiments, an optical sensor 764 is located on the back of device 700, opposite touch screen display 712 on the front of the device, so that the touch screen display 712 may be used as a viewfinder for still and/or video image acquisition. In some embodiments, another optical sensor is located on the front of the device so that the user's image may be obtained for videoconferencing while the user views the other video conference participants on the touch screen display.

Device 700 may also include one or more proximity sensors 766. FIG. 7 shows proximity sensor 766 coupled to peripherals interface 718. Alternately, proximity sensor 766 may be coupled to input controller 760 in I/O subsystem 706. In some embodiments, the proximity sensor 766 turns off and disables touch screen 712 when the multifunction device 700 is placed near the user's ear (e.g., when the user is making a phone call).

Device 700 includes one or more orientation sensors 768. In some embodiments, the one or more orientation sensors 768 include one or more accelerometers (e.g., one or more linear accelerometers and/or one or more rotational accelerometers). In some embodiments, the one or more orientation sensors 768 include one or more gyroscopes. In some embodiments, the one or more orientation sensors 768 include one or more magnetometers. In some embodiments, the one or more orientation sensors 768 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 700. In some embodiments, the one or more orientation sensors 768 include any combination of orientation/rotation sensors. FIG. 7 shows the one or more orientation sensors 768 coupled to peripherals interface 718. Alternately, the one or more orientation sensors 768 may be coupled to an input controller 760 in I/O subsystem 706. In some embodiments, information is displayed on the touch screen display 712 in a portrait view or a landscape view based on an analysis of data received from the one or more orientation sensors 768.

In some embodiments, the software components stored in memory 702 include operating system 726, communication module (or set of instructions) 728, contact/motion module (or set of instructions) 730, graphics module (or set of instructions) 732, text input module (or set of instructions) 734, Global Positioning System (GPS) module (or set of instructions) 735, arbiter module 758 and applications (or sets of instructions) 736. Furthermore, in some embodiments memory 702 stores device/global internal state 757. Device/global internal state 757 includes one or more of: active application state, indicating which applications, if any, are currently active; display state, indicating what applications, views or other information occupy various regions of touch screen display 712; sensor state, including information obtained from the device's various sensors and input control devices 716; and location information concerning the device's location and/or attitude.

Operating system 726 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 728 facilitates communication with other devices over one or more external ports 724 and also includes various software components for handling data received by RF circuitry 708 and/or external port 724. External port 724 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 730 may detect contact with touch screen 712 (in conjunction with display controller 756) and other touch sensitive devices (e.g., a touchpad or physical click wheel). In some embodiments, contact/motion module 730 and display controller 756 detect contact on a touchpad. Contact/motion module 730 may detect a gesture input by a user. Different gestures on the touch-sensitive surface have different contact patterns. Graphics module 732 includes various known software components for rendering and displaying graphics on touch screen 712 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like. Text input module 734, which may be a component of graphics module 732, provides soft keyboards for entering text in various applications (e.g., contacts, e-mail, and any other application that needs text input). GPS module 735 determines the location of the device and provides this information for use in various applications 736 (e.g., to a camera application as picture/video metadata).

Applications 736 may include one or more modules (e.g., a contacts module, an email client module, a camera module for still and/or video images, etc.) Examples of other applications 736 that may be stored in memory 702 include other word processing applications, other image editing applications, drawing applications, presentation applications, JAVA-enabled applications, encryption, digital rights management, voice recognition, and voice replication. Each of the modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 702 may store a subset of the modules and data structures identified above. Furthermore, memory 702 may store additional modules and data structures not described above.

Figure 8:
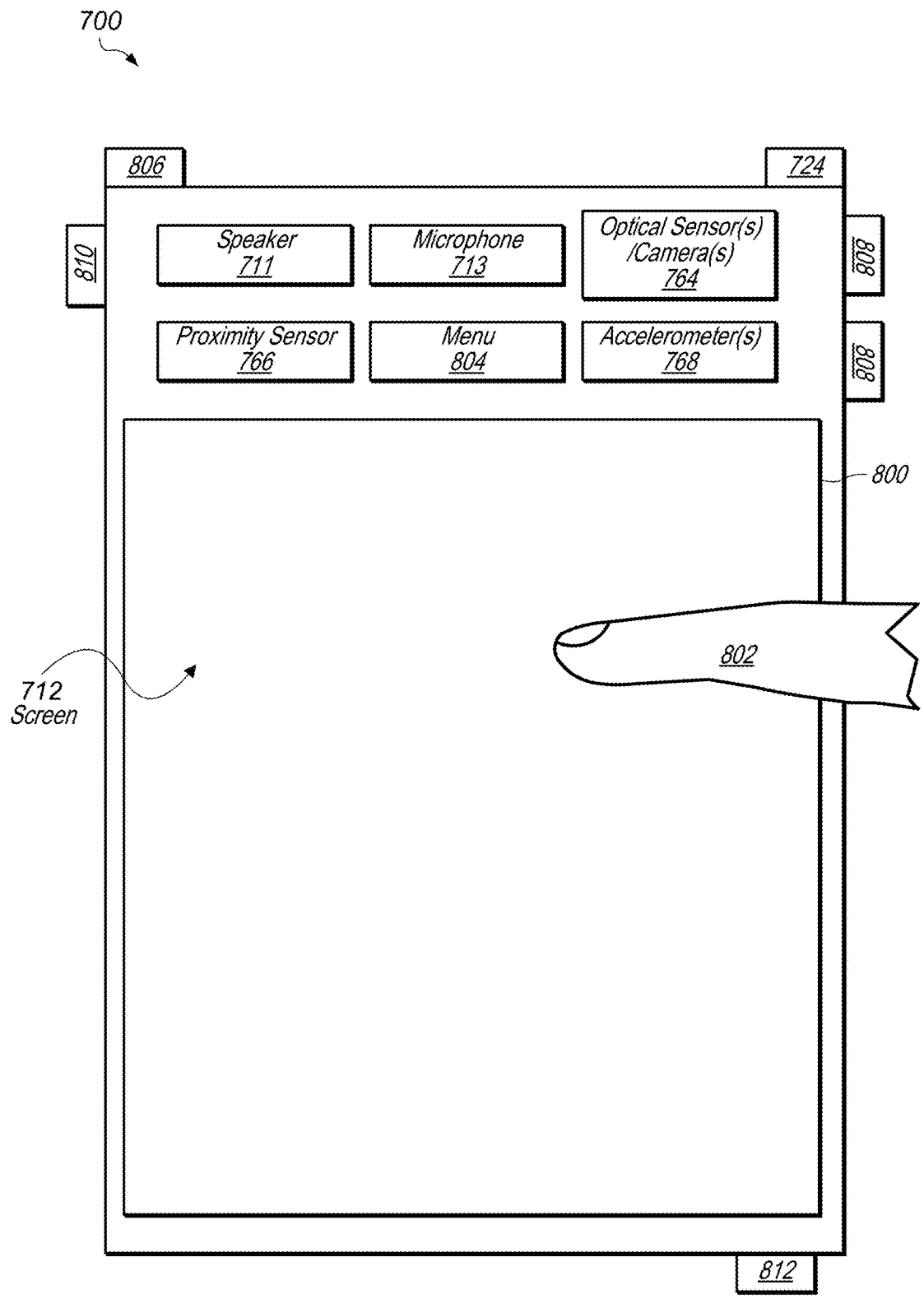
FIG. 8 depicts an example portable multifunction device that may include a camera comprising a lens and one more refractive index layers, in accordance with some embodiments.

FIG. 8 depicts an example portable multifunction device 700 that may include a camera having a reflection interface, in accordance with some embodiments. In some embodiments, the portable multifunction device 700 may include one or multiple features, components, and/or functionality of embodiments described herein with reference to FIGS. 1-7 and 9.

The device 700 may have a touch screen 712. The touch screen 712 may display one or more graphics within user interface (UI) 800. In this embodiment, as well as others described below, a user may select one or more of the graphics by making a gesture on the graphics, for example, with one or more fingers 802 (not drawn to scale in the figure) or one or more styluses 803 (not drawn to scale in the figure).

Device 700 may also include one or more physical buttons, such as "home" or menu button 804. As described previously, menu button 804 may be used to navigate to any application 736 in a set of applications that may be executed on device 700. Alternatively, in some embodiments, the menu button 804 is implemented as a soft key in a GUI displayed on touch screen 712.

In one embodiment, device 700 includes touch screen 712, menu button 804, push button 806 for powering the device on/off and locking the device, volume adjustment button(s) 808, Subscriber Identity Module (SIM) card slot 810, head set jack 812, and docking/charging external port 724. Push button 806 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 700 also may accept verbal input for activation or deactivation of some functions through microphone 713.

It should be noted that, although many of the examples herein are given with reference to optical sensor(s)/camera (s) 764 (on the front of a device), one or more rear-facing cameras or optical sensors that are pointed opposite from the display may be used instead of, or in addition to, an optical sensor(s)/camera(s) 764 on the front of a device.

Figure 9:
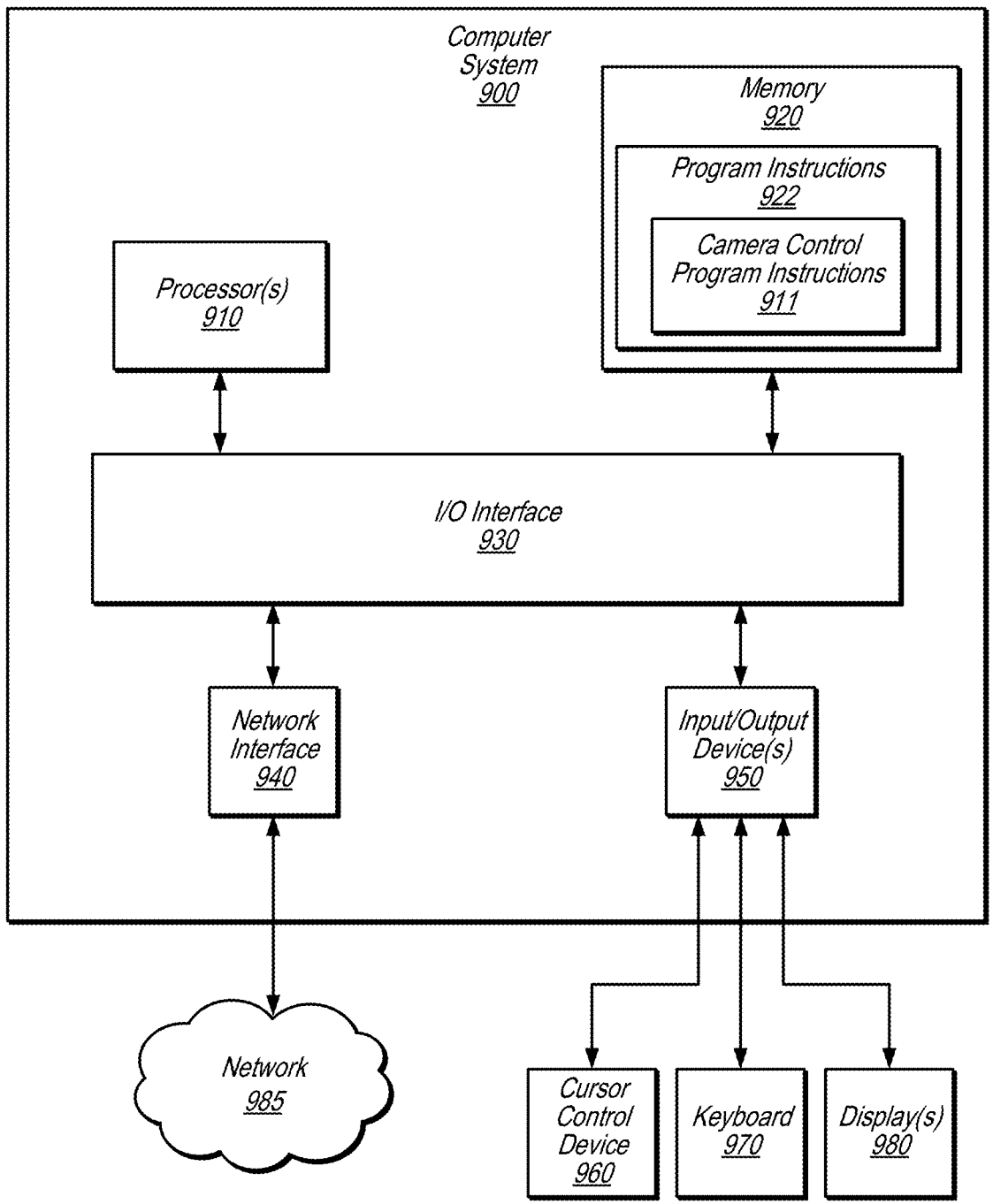
FIG. 9 illustrates an example computer system that may include a camera comprising a lens and one more refractive index layers, in accordance with some embodiments.

FIG. 9 illustrates an example computer system 900 that may include a camera having a reflection interface, in accordance with some embodiments. In some embodiments, the computer system 900 may include one or multiple features, components, and/or functionality of embodiments described herein with reference to FIGS. 1-8.

The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 900, which may interact with various other devices. Note that any component, action, or functionality described above with respect to FIGS. 1-14 may be implemented on one or more computers configured as computer system 900 of FIG. 9, according to various embodiments. In the illustrated embodiment, computer system 900 includes one or more processors 910 coupled to a system memory 920 via an input/output (I/O) interface 930. Computer system 900 further includes a network interface 940 coupled to I/O interface 930, and one or more input/output devices 950, such as cursor control device 960, keyboard 970, and display(s) 980. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 910, or a multiprocessor system including several processors 910 (e.g., two, four, eight, or another suitable number). Processors 910 may be any suitable processor capable of executing instructions. For example, in various embodiments processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 910 may commonly, but not necessarily, implement the same ISA.

System memory 920 may be configured to store camera control program instructions 922 and/or camera control data accessible by processor 910. In various embodiments, system memory 920 may be implemented using any suitable memory technology, such as static random access memory (SRAM), synchronous dynamic RAM (SDRAM), nonvolatile/Flash-type memory, or any other type of memory. In the illustrated embodiment, program instructions 922 may be configured to implement a lens control application 924 incorporating any of the functionality described above. Additionally, existing camera control data 932 of memory 920 may include any of the information or data structures described above. In some embodiments, program instructions and/or data may be received, sent or stored upon different types of computer-accessible media or on similar media separate from system memory 920 or computer system 900. While computer system 900 is described as implementing the functionality of functional blocks of previous Figures, any of the functionality described herein may be implemented via such a computer system.

In one embodiment, I/O interface 930 may be configured to coordinate I/O traffic between processor 910, system memory 920, and any peripheral devices in the device, including network interface 940 or other peripheral interfaces, such as input/output devices 950. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices attached to a network 985 (e.g., carrier or agent devices) or between nodes of computer system 900. Network 985 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 940 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 950 may, in some embodiments, include one or more display terminals, keyboards, keypads, touchpads, scanning devices, voice or optical recognition devices, or any other devices suitable for entering or accessing data by one or more computer systems 900. Multiple input/output devices 950 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 940.

As shown in FIG. 9, memory 920 may include program instructions 922, which may be processor-executable to implement any element or action described above. In one embodiment, the program instructions may implement the methods described above. In other embodiments, different elements and data may be included. Note that data may include any data or information described above.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A device, comprising:
   a lens;
   an image sensor; and
   a refractive index layer located between the image sensor and the lens; and
   an additional layer located between the image sensor and the refractive index layer;
   the refractive index layer comprising:
   a vacuum layer,
   a gas other than air, or
   beads;
   wherein at least a portion of light directed to a focus position on the sensor and reflected off of the image sensor enters the additional layer and is internally reflected within the additional layer back toward the image sensor by a boundary between the refractive index layer and the additional layer, wherein the light reflected back toward the image sensor is not internally reflected within the additional layer by another boundary of the additional layer facing the image sensor so that the light reflected back is limited to an area of the image sensor closer to the focus position than if the light had been reflected back to the image sensor by another boundary on a side of the lens opposite from the refractive index layer.

2. The device of claim 1, wherein the device comprises more than one lens, wherein the boundary formed with the refractive index layer is located proximate to the image sensor such that a distance between the image sensor and the boundary is less than a distance between an outer surface of any of the lens of the device and the image sensor.

3. The device of claim 1, wherein the refractive index layer is a flat layer applied to a surface of the lens closest to the image sensor.

4. The device of claim 1, wherein the refractive index layer comprises:
   silica beads comprising air therein; and
   binding material surrounding one or more of the silica beads.

5. The device of claim 1, wherein the index of refraction of the refractive index layer is less than 1.3.

6. The device of claim 1, wherein:
   the device comprises:
      a lower lens assembly comprising one or more lower lenses; and
      an upper lens assembly comprising one or more upper lenses held by a lens holder, wherein:
         the lower lens assembly is located between the lens holder of the upper lens assembly and the image sensor, and
         the lens is included as one of the one or more lower lenses of the lower lens assembly.

7. The device of claim 1, wherein the refractive index layer comprises air within the beads.

8. The device of claim 1, wherein the lens is a concave lens or a field flattener lens.

9. The device of claim 1, wherein:
   the lens is located proximate to the image sensor; and
   the refractive index layer is on a side of the lens closest to the image sensor.

10. A camera module, comprising:
    a lens;
    an image sensor configured to capture light that has passed through the lens;
    a refractive index layer that forms a boundary between the lens and the image sensor; and
    an additional layer located between the image sensor and the refractive index layer;
    the refractive index layer comprising:
       a vacuum layer,
       a gas other than air,
       or beads,
    wherein:
       at least a portion of light directed to a focus position on the image sensor and reflected off of the image sensor enters the additional layer and is internally reflected back toward the image sensor by a boundary between the refractive index layer and the additional layer, wherein the light reflected back toward the image sensor is not internally reflected within the additional layer by another boundary of the additional layer facing the image sensor so that the light reflected back is limited to an area of the image sensor closer to the focus position than if the light had been reflected back to the image sensor by another boundary located at a side of the lens opposite from the refractive index layer.

11. The camera module of claim 10, wherein the refractive index layer is a layer applied to the lens on a side of the lens facing the image sensor.

12. The camera module of claim 11, wherein the refractive index layer comprises:
    silica beads comprising air therein; and
    binding material surrounding one or more of the silica beads.

13. The camera module of claim 10, wherein the lens is a concave lens.

14. The camera module of claim 10, wherein:
    an index of refraction of a material on a side of the boundary closest to the image sensor is greater than 1.4; and
    an index of refraction of a material on an opposite side of the boundary is less than 1.3.

15. The camera module of claim 10, wherein:
    a glass layer is attached to the image sensor between the refractive index layer and the image sensor; and
    the refractive index layer further comprises a gap portion between the glass layer and the lens.

16. An image sensor package, comprising:
    a lens;
    a refractive index layer comprising:
       a vacuum layer,
       a gas other than air, or
       beads;
    an image sensor configured to capture light that has passed through the lens; and
    an additional layer located between the image sensor and the refractive index layer;
    wherein at least a portion of light directed to a focus position on the image sensor and reflected off of the image sensor enters the additional layer and is internally reflected within the additional layer back toward the image sensor by a boundary between the refractive index layer and the additional layer, wherein the light reflected back toward the image sensor is not internally reflected within the additional layer by another boundary of the additional layer facing the image sensor so that the light reflected back is limited to an area of the image sensor closer to the focus position than if the light had been reflected back to the image sensor by another boundary on an opposite side of the lens from the refractive index layer.

17. The image sensor package of claim 16, wherein the refractive index layer comprises:
    silica beads comprising air therein; and
    binding material surrounding one or more of the silica beads.

18. The image sensor package of claim 16, wherein a glass layer is attached to the image sensor between the refractive index layer and the image sensor via an adhesive.

19. The image sensor package of claim 18, wherein the lens is a concave lens.

20. The image sensor package of claim 18, wherein the lens is a field flattener lens.

* * * * *